United States Patent
Fleming et al.

(10) Patent No.: US 10,677,022 B2
(45) Date of Patent: Jun. 9, 2020

(54) SYSTEMS AND METHODS FOR SOLVING A MULTI-RESERVOIR SYSTEM WITH HETEROGENEOUS FLUIDS COUPLED TO A COMMON GATHERING NETWORK

(71) Applicant: LANDMARK GRAPHICS CORPORATION, Houston, TX (US)

(72) Inventors: Graham Christopher Fleming, Houston, TX (US); Terry Wayne Wong, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 567 days.

(21) Appl. No.: 14/408,196

(22) PCT Filed: May 28, 2013

(86) PCT No.: PCT/US2013/042823
§ 371 (c)(1),
(2) Date: Dec. 15, 2014

(87) PCT Pub. No.: WO2013/188087
PCT Pub. Date: Dec. 19, 2013

(65) Prior Publication Data
US 2015/0127314 A1    May 7, 2015

Related U.S. Application Data

(60) Provisional application No. 61/660,627, filed on Jun. 15, 2012.

(51) Int. Cl.
*E21B 43/00*  (2006.01)
*G06F 30/20*  (2020.01)

(52) U.S. Cl.
CPC .............. *E21B 43/00* (2013.01); *G06F 30/20* (2020.01)

(58) Field of Classification Search
CPC .................................................. G06F 17/5009
See application file for complete search history.

(56) References Cited

U.S. PATENT DOCUMENTS

| 4,683,948 A | 8/1987 | Fleming |
| 4,699,213 A | 10/1987 | Fleming |
(Continued)

FOREIGN PATENT DOCUMENTS

WO   2013/188087   12/2013

OTHER PUBLICATIONS

Fleming, G., & Wong, T. (Feb. 18, 2013). Fully Coupled Simulation of Multiple Compositional Reservoirs With a Shared Facility Network. Society of Petroleum Engineers. 19pages, doi:10.2118/163632-MS.*

(Continued)

*Primary Examiner* — Omar F Fernandez Rivas
*Assistant Examiner* — Robert S Brock
(74) *Attorney, Agent, or Firm* — Jason Sedano; Parker Justiss, P.C.

(57) ABSTRACT

Systems and methods for determining operating settings of a fluid production system with a gathering network and a plurality of reservoirs, at least some of which include a method that includes lumping common pseudo-components into reservoir pseudo-components associated with each of the reservoirs. Each common pseudo-component is associated with the gathering network and maps to one reservoir pseudo-component of each of the reservoirs. The method further includes performing at least part of a fully-coupled simulation of the gathering network and the reservoirs using the common pseudo-components to obtain one or more operating settings that meet one or more constraints of the production system, and presenting to a user the operating settings.

20 Claims, 6 Drawing Sheets

(56) References Cited

U.S. PATENT DOCUMENTS

| | | | |
|---|---|---|---|
| 6,108,608 A | | 8/2000 | Watts, III |
| 6,662,146 B1* | | 12/2003 | Watts ............... E21B 49/00 703/10 |
| 6,985,841 B2 | | 1/2006 | Barroux |
| 7,277,836 B2* | | 10/2007 | Netemeyer ............ G01V 11/00 703/6 |
| 7,289,943 B2 | | 10/2007 | Barroux |
| 7,379,853 B2* | | 5/2008 | Middya ............... E21B 43/00 702/13 |
| 7,761,270 B2* | | 7/2010 | Banki ............... G01V 11/00 703/10 |
| 9,104,585 B2* | | 8/2015 | Dogru ............... G06F 17/10 |
| 10,387,591 B2* | | 8/2019 | Wong ............... E21B 41/0092 |
| 2007/0061087 A1 | | 3/2007 | Ghorayeb et al. |
| 2007/0112547 A1 | | 5/2007 | Ghorayeb et al. |
| 2009/0012765 A1* | | 1/2009 | Raphael ............... E21B 43/00 703/10 |
| 2009/0084544 A1 | | 4/2009 | Caldera |
| 2010/0250215 A1 | | 9/2010 | Kennon et al. |
| 2012/0150518 A1* | | 6/2012 | Guyaguler ............ E21B 41/00 703/10 |
| 2012/0203515 A1* | | 8/2012 | Pita ............... E21B 49/00 703/2 |
| 2012/0232861 A1* | | 9/2012 | Lu ............... G01V 99/00 703/2 |
| 2012/0296617 A1* | | 11/2012 | Zuo ............... E21B 47/10 703/10 |
| 2015/0081265 A1* | | 3/2015 | Kauerauf ............ G06F 17/5009 703/10 |
| 2016/0098502 A1* | | 4/2016 | Havre ............... E21B 43/00 703/9 |
| 2016/0154907 A1* | | 6/2016 | Halabe ............... G06F 17/5009 703/7 |
| 2016/0319640 A1* | | 11/2016 | Ratulowski ............ E21B 49/00 |
| 2016/0341015 A1* | | 11/2016 | Fung ............... G06F 17/16 |
| 2017/0091359 A1* | | 3/2017 | Wong ............... E21B 43/14 |
| 2019/0211651 A1* | | 7/2019 | Fleming ............. E21B 41/0092 |

OTHER PUBLICATIONS

Ghorayeb, K., Holmes, J., Torrens, R., & Grewal, B. (Jan. 1, 2003). A General Purpose Controller for Coupling Multiple Reservoir Simulations and Surface Facility Networks. Society of Petroleum Engineers. 15 pages, doi:10.2118/79702-MS.*

Guyaguler, B., & Ghorayeb, K. (Jan. 1, 2006). Integrated Optimization of Field Development, Planning, and Operation. Society of Petroleum Engineers. 13 pages, doi:10.2118/102557-MS.*

Litvak, M. L., & Darlow, B. L. (Jan. 1, 1995). Surface Network and Well Tubinghead Pressure Constraints in Compositional Simulation. Society of Petroleum Engineers., pp. 325-336, doi:10.2118/29125-MS.*

Al-Matar, et al. "Next-Generation Modeling of a Middle Eastern Multireservoir Complex." In SPE/EAGE Reservoir Characterization & Simulation Conference. 2009. 17 pages (Year: 2009).*

Barroux, C. C., P. Duchet-Suchaux, P. Samier, and R. Nabil. "Linking reservoir and surface simulators: how to improve the coupled solutions." In SPE European Petroleum Conference. Society of Petroleum Engineers, 2000. 14 pages (Year: 2000).*

Litvak, M. L., and C. H. Wang. "Integrated reservoir and surface pipeline network compositional simulations." In SPE International Oil and Gas Conference and Exhibition in China. Society of Petroleum Engineers, 1998. 9 pages (Year: 1998).*

Shiralkar, et al. "Development and field application of a high performance, unstructured simulator with parallel capability." In SPE Reservoir Simulation Symposium. Society of Petroleum Engineers, 2005. 10 pages (Year: 2005).*

Coats, B. K., G. C. Fleming, J. W. Watts, M. Rame, and G. S. Shiralkar. "A generalized wellbore and surface facility model, fully coupled to a reservoir simulator." SPE Reservoir Evaluation & Engineering 7, No. 02 (2004): 132-142. (Year: 2004).*

Debaun, David, T. Byer, P. Childs, J. Chen, F. Saaf, M. Wells, J. Liu et al. "An extensible architecture for next generation scalable parallel reservoir simulation." In SPE Reservoir Simulation Symposium. Society of Petroleum Engineers, 2005. 13 pages (Year: 2005).*

Leibovici, C. F., J. W. Barker, and David Wache. "Method for Delumping the Results of Compositional Reservoir Simulation." SPE Journal 5, No. 02 (2000): 227-235. (Year: 2000).*

Vignati, Emanuele, Alberto Cominelli, Roberto Rossi, and Paolo Roscini. "Innovative implementation of compositional delumping in integrated asset modeling." SPE Reservoir Evaluation & Engineering 12, No. 04 (2009): 639-650. (Year: 2009).*

PCT International Preliminary Report on Patentability, dated Jul. 3, 2014, Appl No. PCT/US2013/042823, "Systems and Methods for Solving a Multi-Reservoir System with Heterogeneous Fluids Coupled to a Common Gathering Network," filed May 28, 2013, 7 pgs.

PCT International Search Report and Written Opinion, dated Nov. 12, 2013, Appl No. PCT/US2013/042823, "Systems and Methods for Solving a Multi-Reservoir System with Heterogeneous Fluids Coupled to a Common Gathering Network", filed May 28, 2013, 16 pgs.

* cited by examiner

SYSTEMS AND METHODS FOR SOLVING A MULTI-RESERVOIR SYSTEM WITH HETEROGENEOUS FLUIDS COUPLED TO A COMMON GATHERING NETWORK

CROSS-REFERENCE TO RELATED APPLICATIONS

This application claims priority to Provisional U.S. Application Ser. No. 61/660,627, titled "Solving a Coupled System of Multiple Petroleum Reservoirs with Different Fluid Characterizations that Feed their Production into a Common Surface Network" and filed Jun. 15, 2012 by Graham C. Fleming and Terry W. Wong, which is incorporated herein by reference.

BACKGROUND

Oil field operators dedicate significant resources to improve the recovery of hydrocarbons from reservoirs while reducing recovery costs. To achieve these goals, reservoir engineers both monitor the current state of the reservoir and attempt to predict future behavior given a set of current and/or postulated conditions. Reservoir monitoring, is sometimes referred to as reservoir surveillance, involves the regular collection and monitoring of measured production data from within and around the wells of a reservoir. Such data may include, but is not limited to, water saturation, water and oil cuts, fluid pressure and fluid flow rates. As the data is collected, it is archived into a historical database.

The collected production data, however, mostly reflects conditions immediately around the reservoir wells. To provide a more complete picture of the state of a reservoir, simulations are executed that model the overall behavior of the entire reservoir based on the collected data, both current and historical. These simulations estimate the reservoir's overall current state, producing simulated interwell data values both near and at a distance from the wellbores. Simulated near-wellbore data is regularly correlated against measured near-wellbore data, with modeling parameters being adjusted as needed to reduce the error between the simulated and measured data. Once so adjusted, the simulated interwell data, both near and at a distance from the wellbore, may be relied upon to assess the overall state of the reservoir. Such data may also be relied upon to predict the future behavior of the reservoir based upon either actual or hypothetical conditions input by an operator of the simulator. The results of such predictive simulations may subsequently be used to determine optimal parameters for operating the wells within the reservoirs and thus maximize reservoir production.

Reservoir simulations, particularly those that perform full physics numerical simulations of large reservoirs, are computationally intensive and can take hours, even days to execute. To reduce the execution time and cost of these simulations, individual reservoir fluid components, which can number in the hundreds, are sometimes grouped or "lumped" together into pseudo-components. Each pseudo-component is treated by the simulation as a single component. The components are selected for lumping into a pseudo-component based on a common characteristic within a given range (e.g., molar mass).

For large fields with multiple reservoirs, a gathering network of pipelines and other equipment coupled to the reservoirs collects the extracted product and transports it downstream for further processing. As with the reservoirs, the gathering network is also monitored and simulated to predict how changes in reservoir conditions affect and/or will affect the product provided to a downstream facility. However, as already noted the full simulation of all components of just one reservoir can be prohibitively expensive and time-consuming. Thus, fully simulating multiple reservoirs together with the gathering network to determine the mixed fluids' behavior within the gathering network is generally considered impractical.

Similarly, while using pseudo-components may reduce the number of simulated reservoir components, each reservoir's components are typically different and in different proportions, resulting in different pseudo-components for each reservoir and thus in many cases a prohibitively large number of pseudo-components to simulate together with the gathering network. To overcome this, each reservoir may be simulated separately for a short period of time, with the results of these simulations being used as boundary conditions for a gathering network simulation. The results of the gathering network simulation are then used as boundary conditions for the reservoir simulation for a subsequent time period. The sequence of alternately performing a reservoir simulation followed by a network simulation is repeated until the whole time period of interest has been simulated, and is sometimes referred to as loose coupling. Over time, however, this approach can result in large errors in the simulation results, and in some cases the simulation results may exhibit large oscillations. To help reduce such errors, multiple iterations may be attempted over each time period, an approach sometimes referred to as iterative coupling. Such an approach, however, can be costly and may fail to converge at all.

BRIEF DESCRIPTION OF THE DRAWINGS

A better understanding of the various disclosed embodiments can be obtained when the following detailed description is considered in conjunction with the attached drawings, in which.

It should be understood that the drawings and corresponding detailed description do not limit the disclosure, but on the contrary, they provide the foundation for understanding all modifications, equivalents, and alternatives falling within the scope of the appended claims.

DETAILED DESCRIPTION

The paragraphs that follow describe various illustrative systems and methods for solving a fully-coupled set of equations representing a multi-reservoir system with heterogeneous fluids coupled to a common gathering network.

Illustrative production wells and associated data collection and processing system are first described, followed by a description of a multi-reservoir production field and its associated gathering and processing systems. Simulations of the reservoirs and gathering system are described implementing a pseudo-component lumping/delumping scheme that facilitates solving the reservoir/network system as a fully-coupled system, together with an example of how such pseudo-components may be used with various fluid models. The solution includes operating points for various devices that control fluid production from the reservoirs while honoring constraints factored into the system equations (e.g., reservoir, well and/or gathering network constraints). An illustrative method that performs the disclosed lumping/delumping and associated simulation is described concurrently with a data acquisition and processing system that implements the method. Finally, an example simulation is described together with comparisons of simulation results using different combinations of lumped and delumped pseudo-components.

Figure 1A:
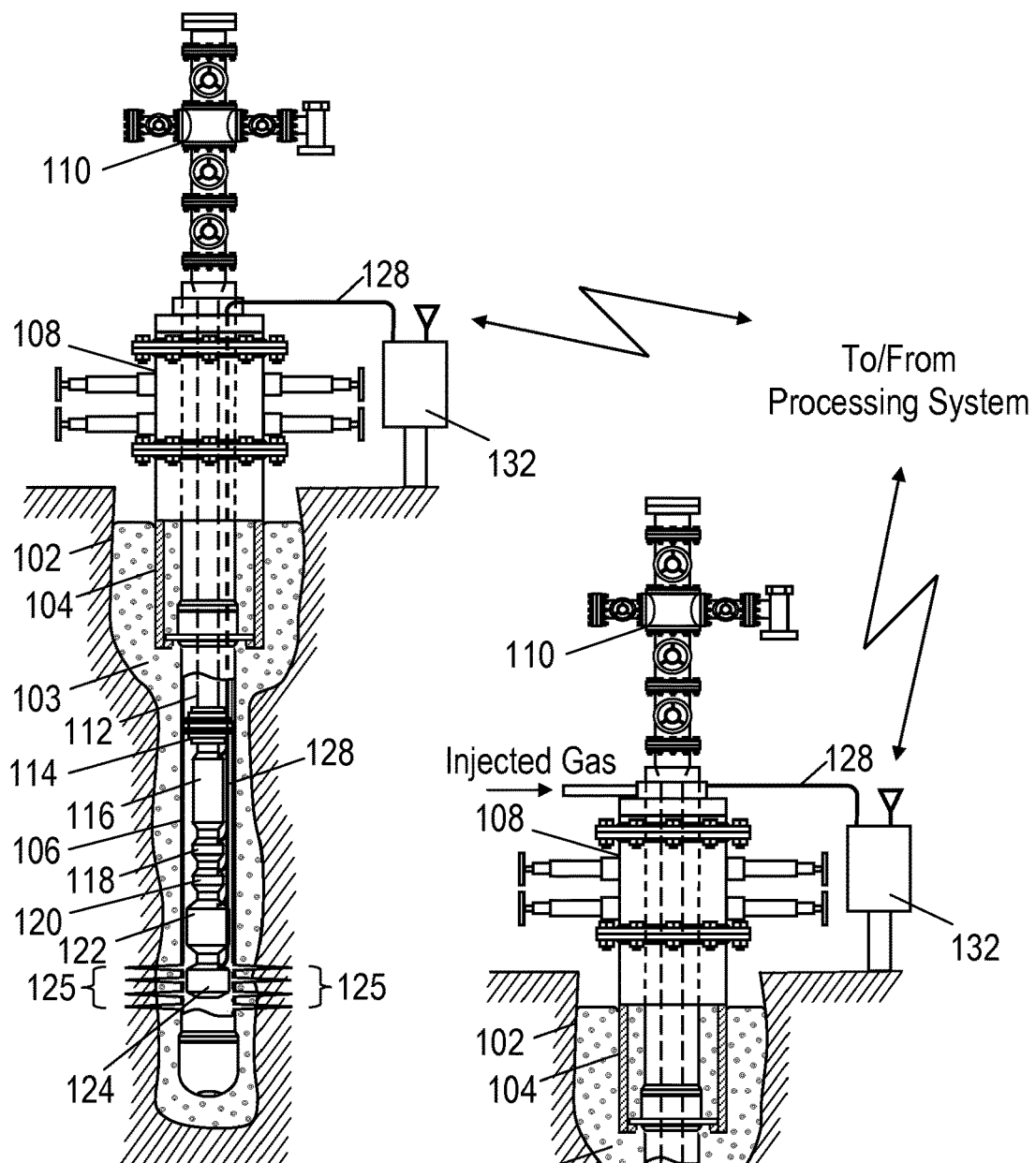
FIGS. 1A and 1B show illustrative completed wells suitable for use with the disclosed methods and system.

The systems and methods described herein operate on measured data collected from wells within a reservoir, such as those found in oil and gas production reservoirs. Such reservoirs generally include multiple producer wells that provide access to the reservoir fluids underground. Measured well data is collected regularly from each producer well to track changing conditions in the reservoir. FIG. 1A shows an example of a producer well with a borehole 102 that has been drilled into the earth. Such boreholes are routinely drilled to ten thousand feet or more in depth and can be steered horizontally for perhaps twice that distance. The producer well also includes a casing header 104 and casing 106, both secured into place by cement 103. Blowout preventer (BOP) 108 couples to casing header 106 and production wellhead 110, which together seal in the well head and enable fluids to be extracted from the well in a safe and controlled manner.

Measured well data is periodically sampled and collected from the producer well and combined with measurements from other wells within a reservoir, enabling the overall state of the reservoir to be monitored and assessed. These measurements may be taken using a number of different downhole and surface instruments, including but not limited to, temperature and pressure sensor 118 and flow meter 120. Additional devices also coupled in-line to production tubing 112 include downhole choke 116 (used to vary the fluid flow restriction), electric submersible pump (ESP) 122 (which draws in fluid flowing from perforations 125 outside ESP 122 and production tubing 112) ESP motor 124 (driving ESP 122), and packer 114 (isolating the production zone below the packer from the rest of the well). Additional surface measurement devices may be used to measure, for example, the tubing head pressure and the electrical power consumption of ESP motor 124. In another illustrative producer well embodiment shown in FIG. 1B, a gas lift injector mandrel 126 is coupled in-line with production tubing 112 that controls injected gas flowing into the production tubing at the surface. Although not shown, the gas lift producer well of FIG. 1B may also include the same type of downhole and surface instruments to provide the above-described measurements.

Each of the devices along production tubing 112 couples to cable 128, which is attached to the exterior of production tubing 112 and is run to the surface through blowout preventer 108 where it couples to control panel 132. Cable 128 provides power to the devices to which it couples, and further provides signal paths (electrical, optical, etc.,) that enable control signals to be directed from the surface to the downhole devices, and for telemetry signals to be received at the surface from the downhole devices. The devices may be controlled and monitored locally by field personnel using a user interface built into control panel 132, or may be controlled and monitored by a remote processing system, such as the processing system 45 shown in FIG. 2 and described below. Communication between control panel 132 and the remote processing system may be via a wireless network (e.g., a cellular network), via a cabled network (e.g., a cabled connection to the Internet), or a combination of wireless and cabled networks.

Figure 1B:
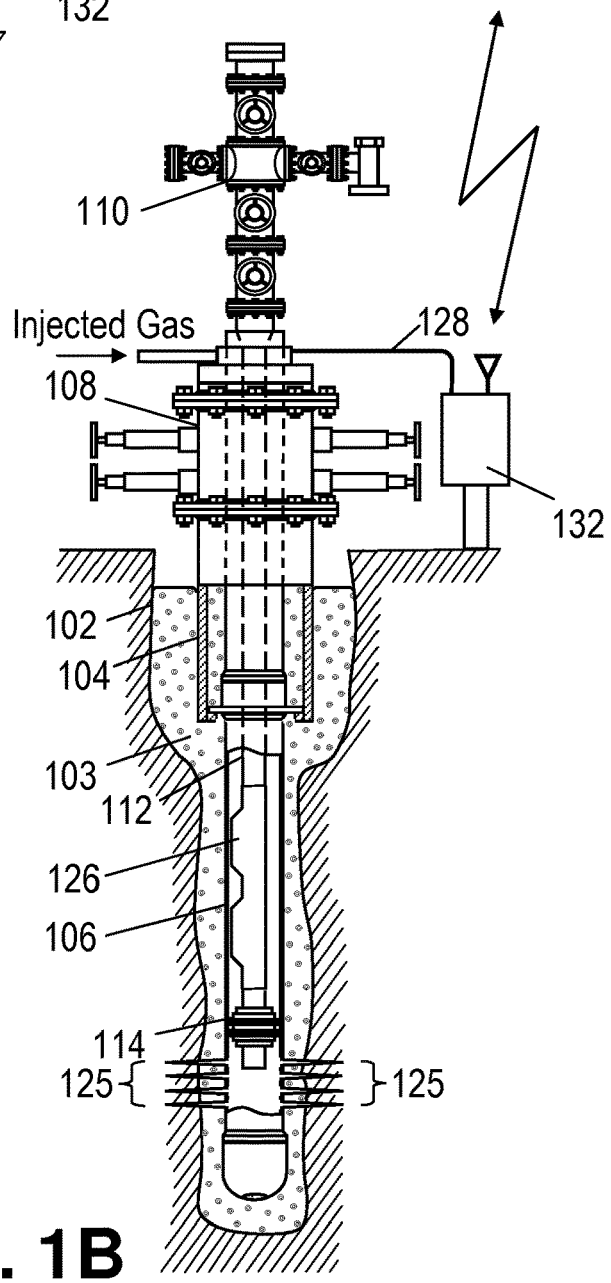
Figure 2:
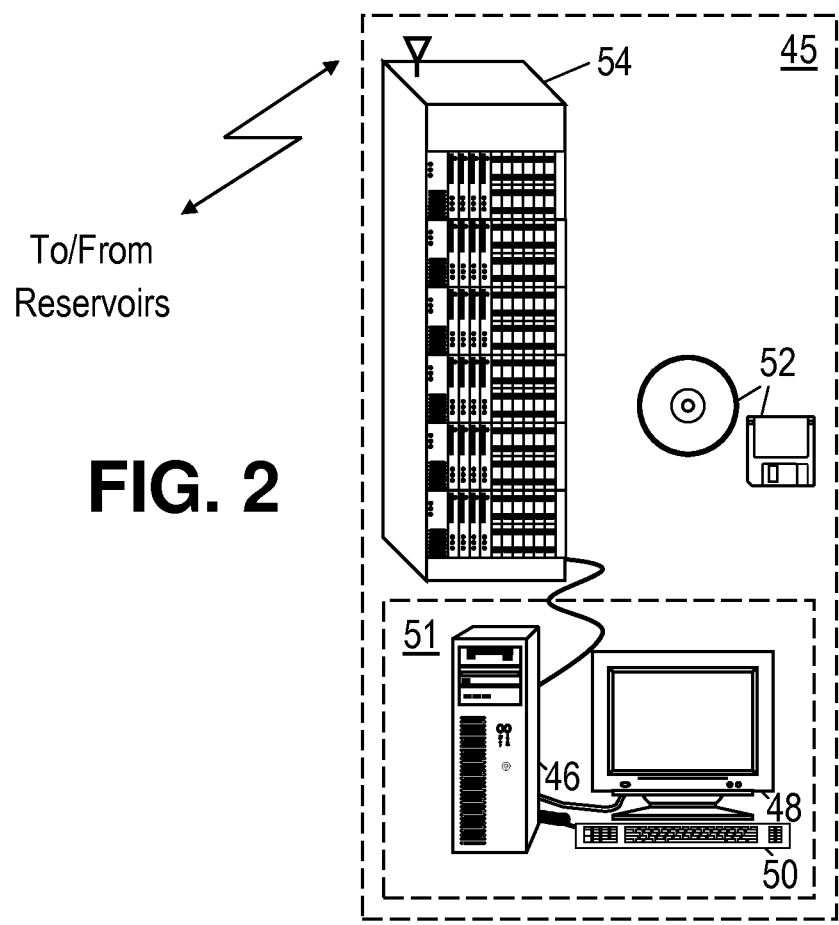
FIG. 2 shows an illustrative processing system suitable for implementing the disclosed methods and system.

For both of the producer well embodiments of FIGS. 1A and 1B, control panel 132 includes a remote terminal unit (RTU) which collects the data from the downhole measurement devices and forwards it to a supervisory control and data acquisition (SCADA) system that is part of a processing system such as processing system 45 of FIG. 2. In the illustrative embodiment shown, processing system 45 includes a blade server-based computer system 54 that includes several processor blades, at least some of which provide the above-described SCADA functionality. Other processor blades may be used to implement the disclosed simulation systems and methods. Processing system 45 also includes user workstation 51, which includes a general purpose processor 46. Both the processor blades of blade server 54 and general purpose processor 46 are preferably configured by software, shown in FIG. 2 in the form of removable, non-transitory (i.e., non-volatile) information storage media 52, to process collected well data within the reservoirs and data from a gathering network (described below) that couples to each well and transfers product extracted from the reservoirs. The software may also include downloadable software accessed through a communication network (e.g., via the Internet). General purpose processor 46 couples to a display device 48 and a user-input device 50 to enable a human operator to interact with the system software 52. Alternatively, display device 48 and user-input device 50 may couple to a processing blade within blade server 54 that operates as general purpose processor 46 of user workstation 51.

Figure 3:
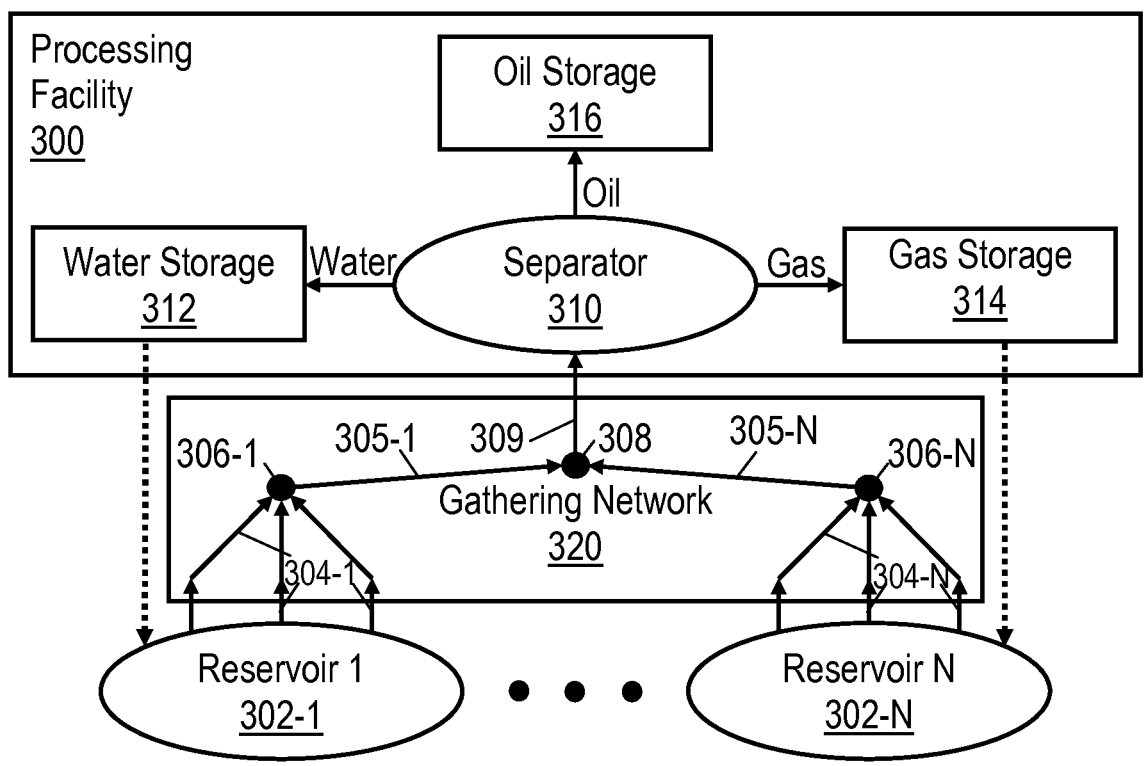
FIG. 3 shows an illustrative block diagram of a production field, gathering network and processing facility that can be simulated as disclosed herein.

As noted above, the wells of each reservoir are coupled together by a gathering network. FIG. 3 shows an illustrative example of a group of N reservoirs 302-1 through 302-N coupled together through a gathering network 320. Individual well lines 304 (1 through N) from each well couple to a reservoir node 306 (1 through N), with each node coupling through a reservoir line 305 (1 through N) to a common node 308. Common node 308 provides mixed product from all the reservoirs through riser 309 to processing facility 300. In the example shown, processing facility 300 includes a separator 310 that receives the mixed product from facility riser 309 and separates the product into water, oil and gas. These separated products are respectively stored in water storage 312, oil storage 316 and gas storage 314 for later use and/or delivery further downstream (e.g., to a refining facility). Alternatively, some of the separated product may be used to assist with the removal of product from the reservoir. For example, some of the separated gas and/or water may be re-injected into one or more reservoirs as part of an enhanced oil recovery (EOR) operation, as shown by the dashed arrows in FIG. 3.

The maximization of the production of hydrocarbons from multiple reservoirs feeding a common gathering network involves controlling the production of each individual well such that the combined production of the wells, or a selected group of the wells, provides the greatest amount of oil and/or gas possible without exceeding any of the processing facility's limits. In at least some illustrative embodiments, the well operating points that enable the operation of the processing facility within its limits are determined using a combination of production well measurements, reservoir characterizations and well, reservoir and facility constraints that are all provided as inputs to a simulator. The simulator uses this data to identify optimal well operating points, expressed as a solution to a simultaneous set of equations. In most cases this solution will not be an exact solution, but instead a solution that provides the greatest oil and/or gas production while most closely approaching the facility constraints, but without exceeding any constraints.

Figure 4:
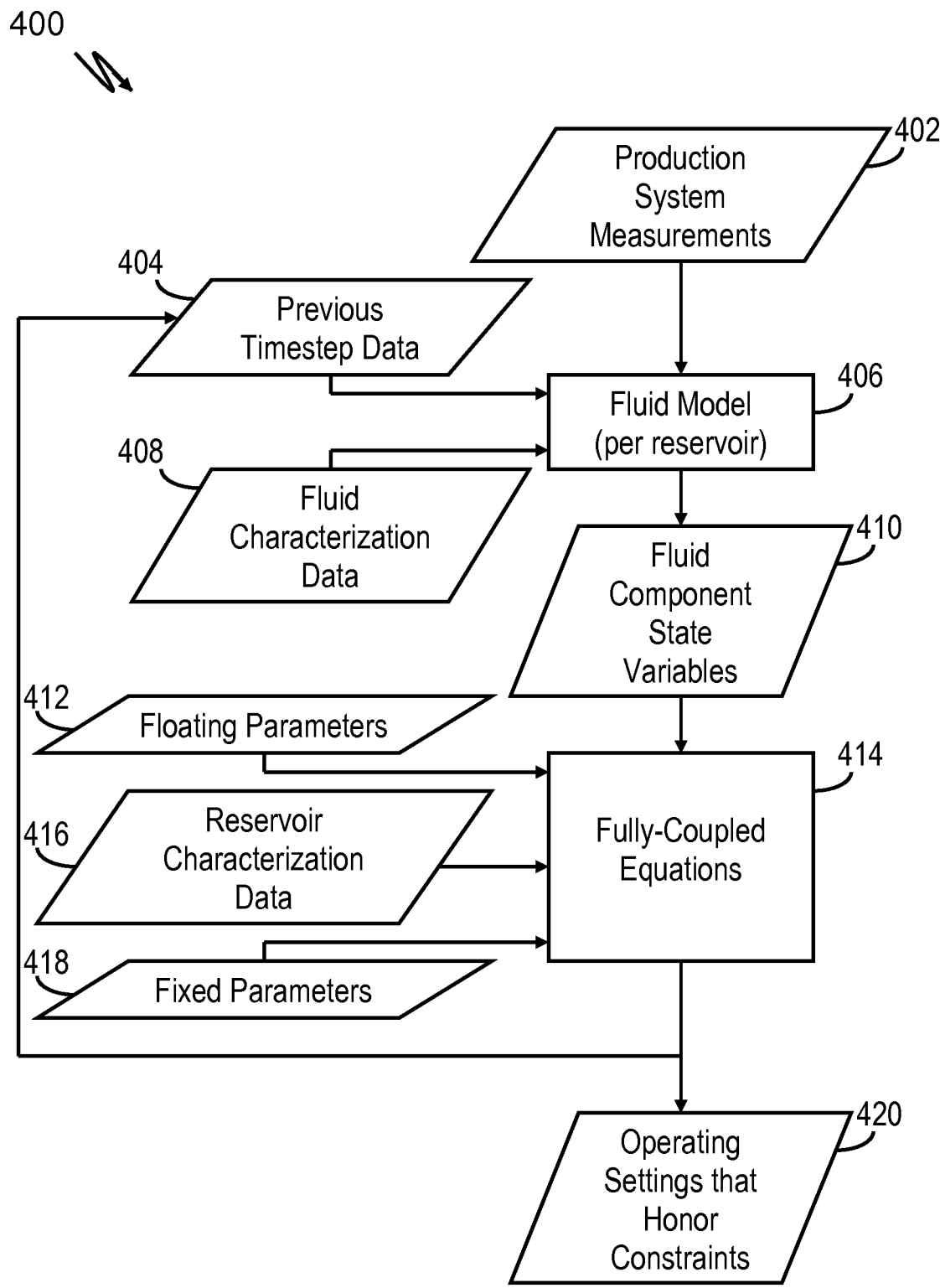
FIG. 4 shows a data flow diagram for an illustrative reservoir simulator.

FIG. 4 shows the data flow for an illustrative simulation 400 that combines available well, reservoir and facility data and constraints (i.e., production system data and constraints) to derive the desired production system operating points for a given simulation timestep. A fluid model 406 for each reservoir accepts as inputs production system measurements 402 (both surface and downhole well measurements), simulated reservoir measurements 404 from prior timesteps, and fluid characterization data 408. Production system measurements 402 may include, but are not limited to pressure, temperature and fluid flow measurements taken downhole near the well perforations, along the production string, at the wellhead and within the gathering network prior to the point where the fluids mix with fluids from other reservoirs. Previous timestep data 404 similarly may represent, without being limited to, updated temperature, pressure and flow data, or other estimates output from fully-coupled equations 414. Fluid characterization data 408 may include the reservoirs' fluid components (e.g., heavy crude, light crude, methane, etc.) and their proportions, fluid density and viscosity for various compositions, pressures and temperatures, or other data.

Based on the above-described data input to the fluid model 406, parameters are determined for each fluid component or group of components of the reservoir. The resulting model for each component/group is then applied to known state variables to calculate unknown state variables at each simulation point or "gridblock" within the reservoir, at the wellbore perforations or "sandface," and within the gathering network. These unknown variables may include a gridblock's liquid volume fraction, solution gas-oil ratio and formation volume factor, just to name a few examples. The resulting fluid component state variables, both measured and calculated, are provided as inputs to fully-coupled equations 414. As shown, the fully-coupled equations 414 also receive floating parameters 412, fixed parameters 418 and reservoir characterization data 416 as inputs. Examples of floating parameters 412 include EOR parameters such as gas lift injection rates, reservoir gas injection rates and reservoir liquid injection rates. Examples of fixed parameters 418 include facility constraints (e.g., a production capacity limit) and default production rates for individual wells. Reservoir characterization data 416 may include geological data describing reservoir formations (e.g., log data previously collected during drilling and/or prior logging of the well) and formation characteristics (e.g., porosity).

Fully-coupled equations 414 represent the entire production system using a single set of equations that provide a solution to the optimization problem of how to maximize production of the reservoirs over time without exceeding any facility constraints. The equations are characterized as "fully-coupled" because all the equations for all the reservoirs and the gathering network are solved simultaneously, rather than solving the reservoir and gathering network separately and iterating between the reservoir and gathering network solutions to determine appropriate boundary conditions for each set of equations (i.e., loosely-coupled). In at least some illustrative embodiments, fully-coupled equations 414 are solved with a Newton method to determine a solution to a set of mass and/or volume balance equations. The equations describe the flow of fluids through the production system and provide a solution that includes operating settings that honor the various production system constraints (block 420). The equations also provide updated fluid data at the end of the overall simulation time-step (e.g., updated fluid component mass and volume values for each gridblock). At least some of the updated parameters may be provided as previous timestep data 404, as shown in FIG. 4. The simulation process 400 may be repeated for each of a plurality of different timesteps, where various parameter values determined for a given timestep are used to update the simulation for the next timestep.

To reduce the number of fluid components processed during at least some of the processing described above, fluid components are grouped together or "lumped" into "pseudo-components" that are each processed as a single component. In at least some embodiments, a two-stage lumping is used wherein the first lumping creates a first common set of pseudo-components that in turn are used to define pseudo-component sets for each reservoir. The combinations and proportions of the common pseudo-components may be different for some or all of the reservoir pseudo-components and each common pseudo-component maps to a reservoir pseudo-component within every reservoir. However, each common pseudo-component maps to no more than one reservoir pseudo-component within a given reservoir. In at least some illustrative embodiments, the selection of components and pseudo-components for lumping is done based on a common characteristic such as molecular weight or boiling point, wherein the components that are lumped together are within a range of values for the selected characteristic.

Figure 5:
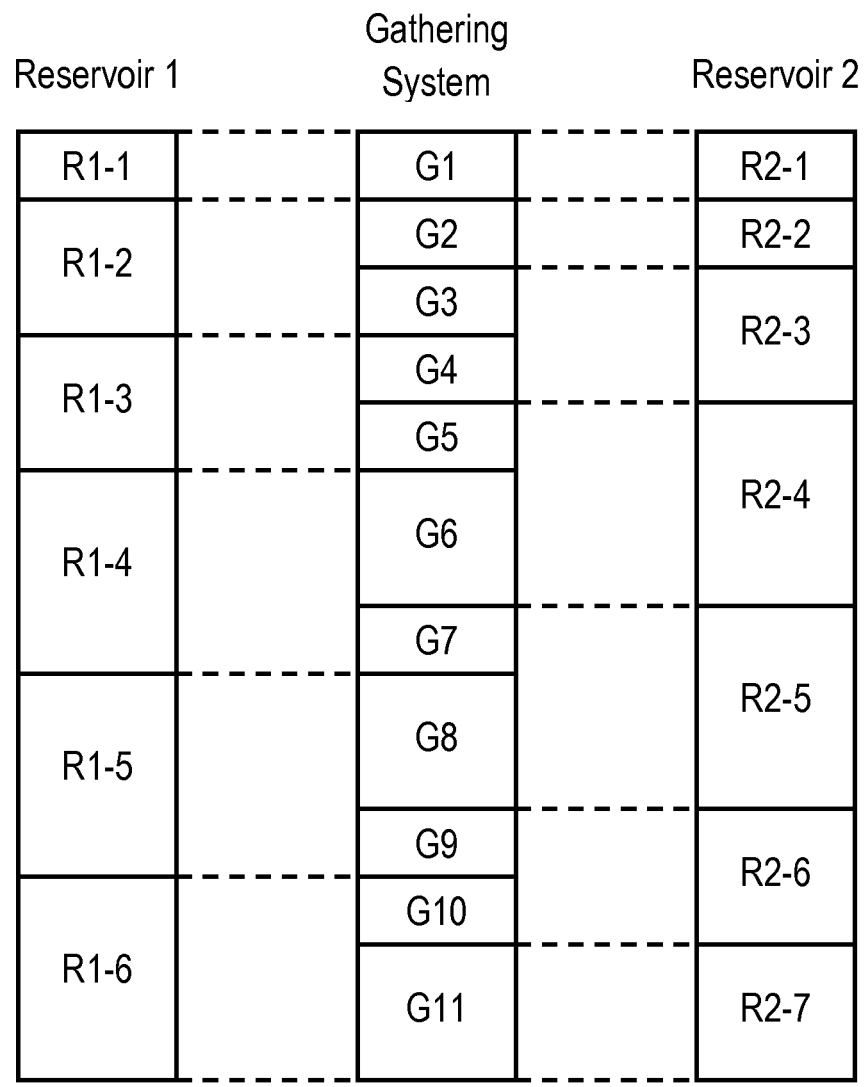
FIG. 5 shows an illustrative lumping/delumping between the pseudo-components of two reservoirs and a gathering system.

FIG. 5 shows an illustrative example of the second stage of the above-described lumping and mapping. A set of common pseudo-components G1-G11 have already been defined in the first stage of lumping, with each component representing any number of real fluid components ranging from one to several hundred components. The actual constituent fluid components of the common pseudo-components are selected such that each reservoir pseudo-component includes at least one of the real fluid components within its corresponding constituent common pseudo-components. The reservoir pseudo-components for each reservoir are each separately defined in terms of the common pseudo-components as shown. Thus, for example, common pseudo-component G2 and G3 together define reservoir pseudo-component R1-2 of reservoir 1, while common pseudo-component G2 maps directly to reservoir pseudo-component R2-2 of reservoir 2. It should also be noted that even though a common pseudo-component may have the same mapping in two different reservoirs, the proportion of that pseudo-component within one reservoir may be different in the other reservoir. Thus, for example, while common pseudo-component G1 of FIG. 4 maps to reservoir pseudo-components R1-1 and R2-1, the percentage of total fluid volume or mass of R1-1 (i.e., G1) in reservoir 1 may be 50% of the total fluid volume or mass of reservoir 1, while the percentage of R2-1 (i.e., also G1) may only be 2% for reservoir 2.

By defining reservoir pseudo-components using common pseudo-components that overlap between reservoirs, the number of reservoir pseudo-components needed to model a single reservoir's fluid can be reduced. The use of overlapping common pseudo-components also enables applying fully-coupled mass/volume balance equations to multiple reservoirs, wells and the gathering network using a larger but still relatively small number of common pseudo-components (e.g., less than the total of all the reservoir pseudo-components). The common pseudo-components represent a common fluid characterization that includes sufficient components to represent the behavior of multiple fluids in different reservoirs.

The definition and use of common and reservoir pseudo-components as described above is better understood through the following example. In this example, a common characterization is used based on an expression of the components as common pseudo-components that are defined based on the components' bulk hydrocarbon composition or is carbon number up to C45. N2, CO2, C1, C2, C3, nC4, iC4, nC5, iC5 and C6 are used with their commonly accepted properties, while the C7+ heavy components are defined using a probability distribution function that provides the molecular weight and mole fraction for each carbon number from C7 to C45. For examples of how such values may be produced using a probability distribution function, see Graham Fleming and Terry Wong, *Fully Coupled Simulation of Multiple Compositional Reservoirs with a Shared Surface Facility Network*, Soc'y of Petroleum Eng'rs Publ'n No. 163632 at 7-9 (February 2013; hereafter "*Simulation Paper*"), hereby incorporated by reference in its entirety. Those of ordinary skill in the art will recognize that other techniques for defining the C7+ heavy components may be suitable for use with disclosed systems and methods, and all such techniques are within the scope of the present disclosure.

Once a set of molecular weights and mole fractions are established, a Watson characterization factor is calculated for each common pseudo-component, which in turn is used to calculate the specific gravity of each common pseudo-component. See *Simulation Paper* at 9. Other techniques for calculating pseudo-component specific gravities and/or other pseudo-component characteristics will become apparent to those of ordinary skill in the art, and all such techniques are within the scope of the present disclosure. The true boiling point (TBP) for each common pseudo-component is also calculated. The molecular weights, TBPs and specific gravities can be combined using any of a number of correlations to calculate the critical properties needed by the fluid models. For example, critical temperatures and pressures may be calculated using the method of Kesler and Lee (1976); acentric factors using the method of Lee and Kesler (1976) when the ratio of TBP and critical temperature is below 0.8 and the method of Kesler and Lee (1976) otherwise; and critical volume or compressibility using the correlation of Riazi and Daubert (1980). For this example, all interaction coefficients are assumed to be zero.

Two fluid models are used in the present example: a lean-gas condensate model and a black oil model. Table 1 summarizes the fluid compositions of the two fluid models as a percentage of a reservoir's total molar mass for each common pseudo-component, while Table 2 summarizes the C7+ properties:

TABLE 1

Common Pseudo-Component Composition

| | Composition (mole %) | |
|---|---|---|
| Component | Lean Gas Condensate | Black Oil |
| C1 | 82.78 | 54.04 |
| C2 | 9.71 | 3.36 |
| C3 | 3.30 | 1.94 |
| iC4 | 0.90 | 0.75 |
| nC4 | 0.52 | 0.43 |
| iC5 | 0.29 | 0.73 |
| nC5 | 0.27 | 0.78 |
| C6 | 0.42 | 2.79 |
| C7+ | 1.81 | 35.18 |

TABLE 2

C7+ Common Pseudo-Component Properties

| Component | Lean Gas Condensate | Black Oil |
|---|---|---|
| Molecular weight C7+ | 135 | 198 |
| Specific gravity C7+ | 0.8060 | 0.8600 |
| Reservoir temperature (° F.) | 200 | 270 |

Table 3 summarizes the C7+ composition, which is defined using five heavy common pseudo-components:

TABLE 3

C7+ Common Pseudo-Component Composition

| | Composition (mole %) | |
|---|---|---|
| Component | Lean Gas Condensate | Black Oil |
| Heavy 1 | 1.5382 | 18.3554 |
| Heavy 2 | 0.2680 | 14.0251 |
| Heavy 3 | 0.0031 | 2.6717 |
| Heavy 4 | 0.0000 | 0.1271 |
| Heavy 5 | 0.0000 | 0.0008 |

Table 4 shows Peng-Robinson equations of state (EOS) parameters for each of the common pseudo-components, determined using the above-described calculations:

TABLE 4

Common Pseudo-Component Peng-Robinson EOS Parameters

| Component | Molecular Wt | $T_c$ (° R) | $P_c$ (psia) | $V_c$ (ft³/lbmol) | Acentric factor | $\Omega_a$ | $\Omega_b$ |
|---|---|---|---|---|---|---|---|
| C1 | 16.04 | 343.07 | 667.80 | 1.59 | 0.013 | 0.45724 | 0.0778 |
| C2 | 30.07 | 549.77 | 707.80 | 2.38 | 0.098 | 0.45724 | 0.0778 |
| C3 | 44.10 | 665.67 | 616.30 | 3.26 | 0.154 | 0.45724 | 0.0778 |
| iC4 | 58.12 | 734.67 | 529.10 | 4.22 | 0.184 | 0.45724 | 0.0778 |
| nC4 | 58.12 | 765.37 | 550.70 | 4.09 | 0.202 | 0.45724 | 0.0778 |
| iC5 | 72.15 | 828.77 | 490.40 | 4.95 | 0.229 | 0.45724 | 0.0778 |
| nC5 | 72.15 | 845.37 | 488.60 | 4.86 | 0.252 | 0.45724 | 0.0778 |
| C6 | 86.18 | 913.37 | 436.90 | 5.92 | 0.300 | 0.45724 | 0.0778 |
| Heavy 1 | 115.52 | 1073.62 | 435.96 | 7.14 | 0.365 | 0.45724 | 0.0778 |

TABLE 4-continued

Common Pseudo-Component Peng-Robinson EOS Parameters

| Component | Molecular Wt | $T_c$ (° R) | $P_c$ (psia) | $V_c$ (ft³/lbmol) | Acentric factor | $\Omega_a$ | $\Omega_b$ |
|---|---|---|---|---|---|---|---|
| Heavy 2 | 244.30 | 1375.16 | 244.36 | 14.11 | 0.729 | 0.45724 | 0.0778 |
| Heavy 3 | 488.80 | 1657.11 | 151.55 | 22.57 | 1.115 | 0.45724 | 0.0778 |
| Heavy 4 | 879.61 | 1871.15 | 119.07 | 28.59 | 1.316 | 0.45724 | 0.0778 |
| Heavy 5 | 1501.77 | 2030.43 | 115.01 | 31.16 | 1.368 | 0.45724 | 0.0778 |

It should be noted that although the example described uses the Peng-Robinson EOS, many other EOS sets may be suitable for use with the disclosed systems and methods, and all such EOS sets are within the scope of the present disclosure.

Once the common pseudo-components are defined as shown in Tables 1-4, the components can be further lumped to create reservoir pseudo-components for each reservoir. For reservoir 1, the C1 through C3 and Heavy 2 (H2) common pseudo-components are mapped one-for-one to their reservoir counterparts. Common pseudo-components iC4 and nC4 are lumped into reservoir pseudo-component C4, and iC5 and nC5 are similarly lumped into C5. C6 and Heavy 1 are lumped into C6_H1, and Heavy 3, 4 and 5 are lumped into H3_H4_H5. For reservoir 2, the C1 and H2 common pseudo-components are mapped one-for-one to their reservoir counterparts. C2 and C3 are lumped into C2_C3; iC4, nC4, iC5 and nC5 into C4_C5; C6 and Heavy 1 into C6_H1; and Heavy 3, 4 and 5 into H3_H4_H5. The EOS parameters for each reservoir pseudo-component are calculated using molar averaging of the constituent common pseudo-component parameters of Table 4. Those or ordinary skill in the art will recognize that techniques other than molar averaging may be suitable for performing the disclosed lumping, and all such techniques are within the scope of the present disclosure. Table 5 shows the Peng-Robinson EOS parameters of the lean gas condensate model used with reservoir 1 for each of its reservoir pseudo-components, while table 6 shows the Peng-Robinson EOS parameters for the black oil model used with reservoir 2 for each of its reservoir pseudo-components:

TABLE 5

Reservoir 1 (Condensate) Pseudo-Component Peng-Robinson EOS Parameters

| Component | Mole % | Molecular Wt | $T_c$ (° R) | $P_c$ (psia) | $V_c$ (ft³/lbmol) | Acentric factor | $\Omega_a$ | $\Omega_b$ |
|---|---|---|---|---|---|---|---|---|
| C1 | 82.7800 | 16.04 | 343.07 | 667.80 | 1.59 | 0.013 | 0.45724 | 0.0778 |
| C2 | 9.7100 | 30.07 | 549.77 | 707.80 | 2.38 | 0.098 | 0.45724 | 0.0778 |
| C3 | 3.3000 | 44.10 | 665.67 | 616.30 | 3.26 | 0.154 | 0.45724 | 0.0778 |
| C4 | 1.4200 | 58.12 | 745.91 | 537.01 | 4.17 | 0.190 | 0.45724 | 0.0778 |
| C5 | 0.5600 | 72.15 | 836.77 | 489.53 | 4.91 | 0.240 | 0.45724 | 0.0778 |
| C6_H1 | 1.9582 | 109.23 | 1039.25 | 436.16 | 6.88 | 0.351 | 0.45724 | 0.0778 |
| H2 | 0.2680 | 244.30 | 1375.16 | 244.36 | 14.11 | 0.729 | 0.45724 | 0.0778 |
| H3_H4_H5 | 0.0031 | 489.01 | 1657.22 | 151.54 | 22.58 | 1.116 | 0.45724 | 0.0778 |

TABLE 6

Reservoir 2 (Black Oil) Pseudo-Component Peng-Robinson EOS Parameters

| Component | Mole % | Molecular Wt | $T_c$ (° R) | $P_c$ (psia) | $V_c$ (ft³/lbmol) | Acentric factor | $\Omega_a$ | $\Omega_b$ |
|---|---|---|---|---|---|---|---|---|
| C1 | 54.0400 | 16.04 | 343.07 | 667.80 | 1.59 | 0.013 | 0.45724 | 0.0778 |
| C2_C3 | 5.3000 | 35.20 | 592.19 | 674.31 | 2.70 | 0.118 | 0.45724 | 0.0778 |
| C4_C5 | 2.6900 | 66.00 | 797.21 | 510.31 | 4.58 | 0.219 | 0.45724 | 0.0778 |
| C6_H1 | 21.1454 | 111.65 | 1052.48 | 436.09 | 6.98 | 0.356 | 0.45724 | 0.0778 |
| H2 | 14.0251 | 244.30 | 1375.16 | 244.36 | 14.11 | 0.729 | 0.45724 | 0.0778 |
| H3_H4_H5 | 2.7995 | 506.83 | 1666.93 | 150.77 | 22.85 | 1.125 | 0.45724 | 0.0778 |

Figure 7:
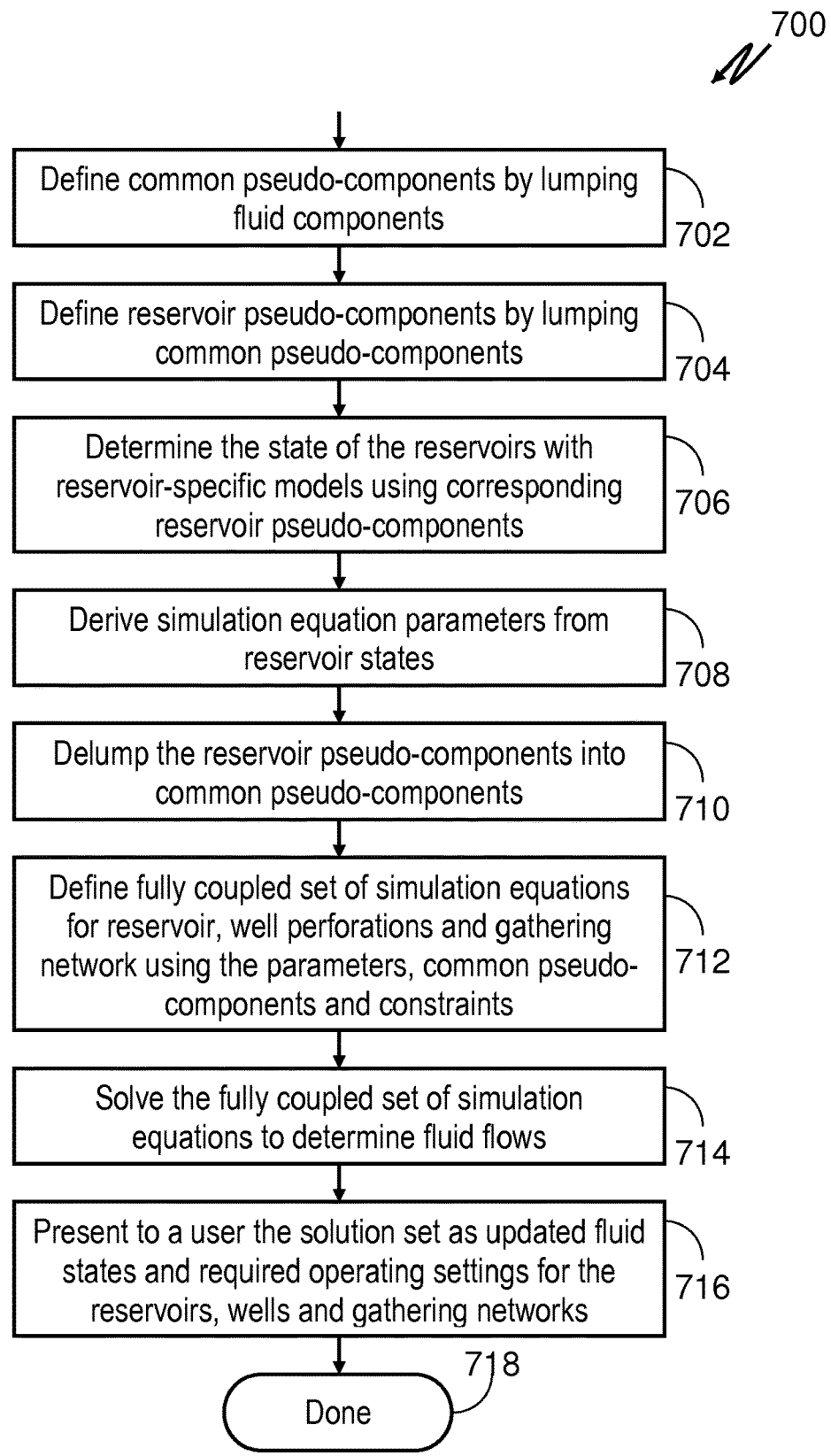
FIG. 7 shows a flowchart describing an illustrative example of the disclosed methods.

Once the EOS parameters have been calculated, the fluid models can be used to determine the state of the fluid pseudo-components within each reservoir, at the well perforations, and within the portions of the gathering network where the fluid from a given reservoir has not yet mixed with fluids from another reservoir. For example, referring again to FIG. 3, the lean gas condensate model can be used to determine the state of fluids within reservoir 1, fluids passing through the perforations of each well within reservoir 1, and fluids within well lines 304-1 and reservoir line 305-1. This process, described in more detail as part of method 700 of FIG. 7, is repeatedly applied to each reservoir and corresponding well perforations, well lines and reservoir lines to determine the state of all unmixed reservoir fluids. The state of the remaining part of the gathering network where fluids from different reservoirs are mixed together (e.g., node 308 and facility riser 309 of FIG. 3) is determined with a model that uses the common pseudo-components as a basis for determining the model's parameters (e.g., the Peng-Robinson EOS parameters of Table 4). In this manner the number of calculations needed to determine the state of the production system (reservoirs/wells/gathering network) is reduced, as compared to determining the overall fluid state by modeling the entire production system using either the actual physical components or only the common pseudo-components.

With the state of the fluids known throughout the production system, the flow of fluid can be simulated using mass/volume balance equations representative of the reservoir, of perforations in the wellbore and of the gathering network. The gathering network may include nodes and connections between nodes that are connected to reservoir gridblocks by perforation equations. Nodes may represent physical locations within the gathering network, other relevant gathering components (e.g., separator 310 of FIG. 3) and/or the wells. Connections can represent pipes or devices such as pumps, compressors or valves, to name just a few examples. In at least some illustrative embodiments, the facility equations representing the gathering network include molar balance equations at the nodes, hydraulic equations, constraint equations, and composition equations. The independent variables for the facility equations include pressure and composition for the nodes, and molar flow rates for the connections.

The full system of equations can be expressed in the form, $$\begin{bmatrix} A_{rr} & 0 & A_{rf} \\ 0 & A_{pp} & A_{pf} \\ 0 & A_{fp} & A_{ff} \end{bmatrix} \begin{bmatrix} \delta x_r \\ \delta x_p \\ \delta x_f \end{bmatrix} = - \begin{bmatrix} R_r \\ R_p \\ R_f \end{bmatrix} \quad (1)$$

where R denotes the residuals, and A the Jacobian for a Newton iteration of the production system simulation. A contains the derivatives of the residuals with respect to the variables x, where $x_r$ includes gridblock moles and pressures, $x_p$ includes perforation flow rates, and $x_f$ includes facility node compositions and pressures and the total molar flow rate of the facility connections. The first row of equations represents the reservoir equations (simulating fluid flow through the reservoir), the second row represents the perforation equations (simulating fluid flow through the perforations), and the third row represents the facility equations (simulating fluid flow through the gathering network).

In at least some illustrative embodiments the reservoir equations include molar balance equations of the form:

$$R_{ri} = F_i^{in} - f_i^{out} - \alpha_i + G_i - \Sigma_{p \in p_r} Q_{rpi} \quad (2)$$

wherein the residual $R_{ri}$ of component i for each reservoir gridblock r is driven to zero at full convergence of the equations. For component i, $F_i^{in}$ and $F_i^{out}$ are the molar flow rates across reservoir gridblock faces, $a_i$ is the rate of accumulation, $G_i$ is the rate of generation and $Q_{rpi}$ is the perforation flow rate (positive for production, negative for injection) between a reservoir gridblock r and a wellbore through perforation p. The $Q_{rpi}$ are summed over the perforations within gridblock r. The independent variables are the mass (in moles) of each component i, and the gridblock pressure. In addition to the molar balance equations, in at least some illustrative embodiments a volume balance equation operates to constrain the pore volume so that it equals the fluid volume. This can be written in residual form as:

$$R_{rnc_r+1} = V_{Pr} - V_{Fr} \quad (3)$$

where $nc_r$ is the number of reservoir pseudo-components, $V_{Pr}$ is the pore volume and $V_{Fr}$ is the fluid volume for gridblock r.

In at least some illustrative embodiments, the perforation equations are expressed as flow equations for each perforation within a reservoir gridblock. Starting with the simpler case of a single reservoir and a gathering network with the same number of pseudo-components, the perforation equation for producing perforations can be expressed using the flow equation, $$Q_{rpi} = C_p \Delta \phi_p \sum_{m=1}^{Nphases} \frac{krel_{rm}}{\mu_{rm}} \rho_{rm} z_{rmi} \quad (4)$$

where $Q_{rpi}$ is the perforation flow rate of fluid pseudo-component i for perforation p within gridblock r, $C_p$ is the wellbore constant (equal to the well index multiplied by the permeability-thickness product), $\Delta\Phi_p$ is the permeability-thickness product (i.e., the potential difference from the reservoir to the wellbore for perforation p), and where for phase m within gridblock r, $krel_{rm}$ is the relative permeability, $\mu_{rm}$ is the viscosity, $\rho_{rm}$ is the density, and $z_{rmi}$ is the mole fraction of fluid pseudo-component i. Similarly, the perforation equation for injecting perforations can be expressed using the flow equation, $$Q_{rpi} = C_p \lambda_p^{inj} \rho_p^{inj} \Delta\Phi_p z_{rpi} \quad (5)$$

where $\lambda_p^{inj}$ is the fluid mobility (e.g., the sum of the gridblock phase mobilities or an endpoint mobility), $\rho_p^{inj}$ is the perforation-injected fluid density, and $z_{rpi}$ is the component mole fraction at a node in the wellbore.

To extend the equations (1) through (5) to a system where the number of gathering network pseudo-components $nc_f$ is different from the number of reservoir pseudo-components $nc_r$, the reservoir pseudo-components are delumped at the perforations. In at least some illustrative embodiments, the lumping and delumping equations are of the form, $$Q_{rpi} = \Sigma_{i=1}^{ncf} \alpha_{ij} Q_{fpi} \quad (6)$$

$$Q_{fpi} = \Sigma_{i=1}^{ncr} \beta_{ij} Q_{rpi} \quad (7)$$

where $\alpha_{ij}$ is an element of an $n_{cf}$ by $n_{cr}$ matrix of lumping coefficients, $\beta_{ij}$ is an element of an $n_{cr}$ by $n_{cf}$ matrix of delumping coefficients, $Q_{rpi}$ and $Q_{rpj}$ are elements of a vector of $n_{cr}$ perforation flow rates of the reservoir pseudo-components, and $Q_{fpi}$ and $Q_{fpi}$ are elements of a vector of $n_{cf}$ perforation flow rates of the facility (common) pseudo-components.

Substituting equation (6) for the left-hand side of equations (4) or (5) gives $nc_r$ equations expressed as a function of the common pseudo-components. Thus, an additional $nc_f$-$nc_r$ components are needed to complete the full system of equations. In at least some illustrative embodiments, the additional equations are obtained by dividing the common pseudo-components into two sets. For each reservoir pseudo-component, one of the common pseudo-components into which it delumps is chosen to be a member of Set 1. This results in $n_{cr}$ pseudo-components in Set 1. Set 2 consists of the remaining $n_{cf}$-$n_{cr}$ common pseudo-components. Applying delumping equation (7) to each set and expressing the solution in vector form produces, $$Q_{fp}^{Set1} = \beta_{Set1} Q_{rp} \quad (8)$$

and $$Q_{fp}^{Set2} = \beta_{Set2} Q_{rp} \quad (9)$$

Solving equation (8) for $Q_{rp}$ and substituting $Q_{rp}$ in equation (9) yields the required $n_{cf}$-$n_{cr}$ equations as, $$Q_{fp}^{Set2} = \beta_{Set2} \beta_{Set1}^{-1} Q_{fp}^{Set1} \quad (10)$$

For injecting perforations, the additional equations relate the perforation common pseudo-component flow rates to the composition of the common fluid at the wellbore node and the total molar flow rate at the perforation, expressed as, $$Q_{fpi}^{Set2} = z_{fpi} \Sigma_{i=1}^{ncf} Q_{fpi} \quad (11)$$

where i is a component in Set 2. Equation (10) imposes the conditions that for each reservoir pseudo-component, the delumped common components are in the correct proportion specified by the delumping equation. In the example embodiment described, the delumping coefficients β are only present in equation (10). The system of equations resulting from the substitution of equation (6) within equations (4) and/or (5), together with equations (10) and/or (11), are incorporated in differential form as the second row of the Jacobian matrix of equation (1). If β is a function of $Q_{rp}$, then the chain rule is applied using (6) to obtain the derivative necessary for the Jacobian with respect to $Q_{fp}$.

It should be noted that the additional $nc_f$-$nc_r$ equations are not limited to those presented in equations (8) through (11). Indeed, the needed equations can be expressed in the more general form, $$\Sigma_{i=1}^{ncf} \rho_{ij} Q_{fpi} = 0 \quad (12)$$

where $p_{ij}$ is the $i^{th}$ coefficient for the perforation flow rate of facility component j. Any of a variety of equation sets suitable for use as the additional $nc_f$-$nc_r$ equations may be derived from this more general form, and all such equations sets are within the scope of the present disclosure.

With a full set of $nc_f$ fully-coupled equations, any of a number of techniques (e.g., a Newton-Raphson method) may be applied to identify a solution set that meets the constraints implicit in said equations while conforming to an acceptable residual range. Such constraints include, but are not limited to, facility constraints (e.g., maximum water rates for the combined fluid accepted), gathering network constraints (e.g., maximum pressure), and well and reservoir constraints (e.g., maximum flow rates). The solution set describes the updated values for the reservoir, perforation and gathering network (e.g., updated fluid component mass and volume values for each reservoir gridblock), as well as reservoir operating settings that honor the constraints included with the equation set. Such operating settings include, but are not limited to, well choke settings, well gas lift injection flow rates, reservoir gas injection rates and reservoir liquid injection flow rates, production well flow rates and maximum/minimum operating pressures. Many other operating settings that can be included within the solution set will become apparent to those of ordinary skill in the art, and all such parameters are within the scope of the present disclosure.

The above equations delump the reservoir pseudo-components into the common pseudo-components at the perforations. However, at any point in the network where the fluid originated from a single reservoir, the composition of the reservoir pseudo-components can be easily and exactly reconstituted using equation (6). In other words, this composition will be exactly the same as would have been obtained if the delumping had not been performed. Fluid properties can be calculated using the reservoir EOS characterization, which is less costly than using the common EOS characterization because it involves fewer components. It will also produce exactly the same result as if the delumping had not been performed.

Figure 6:
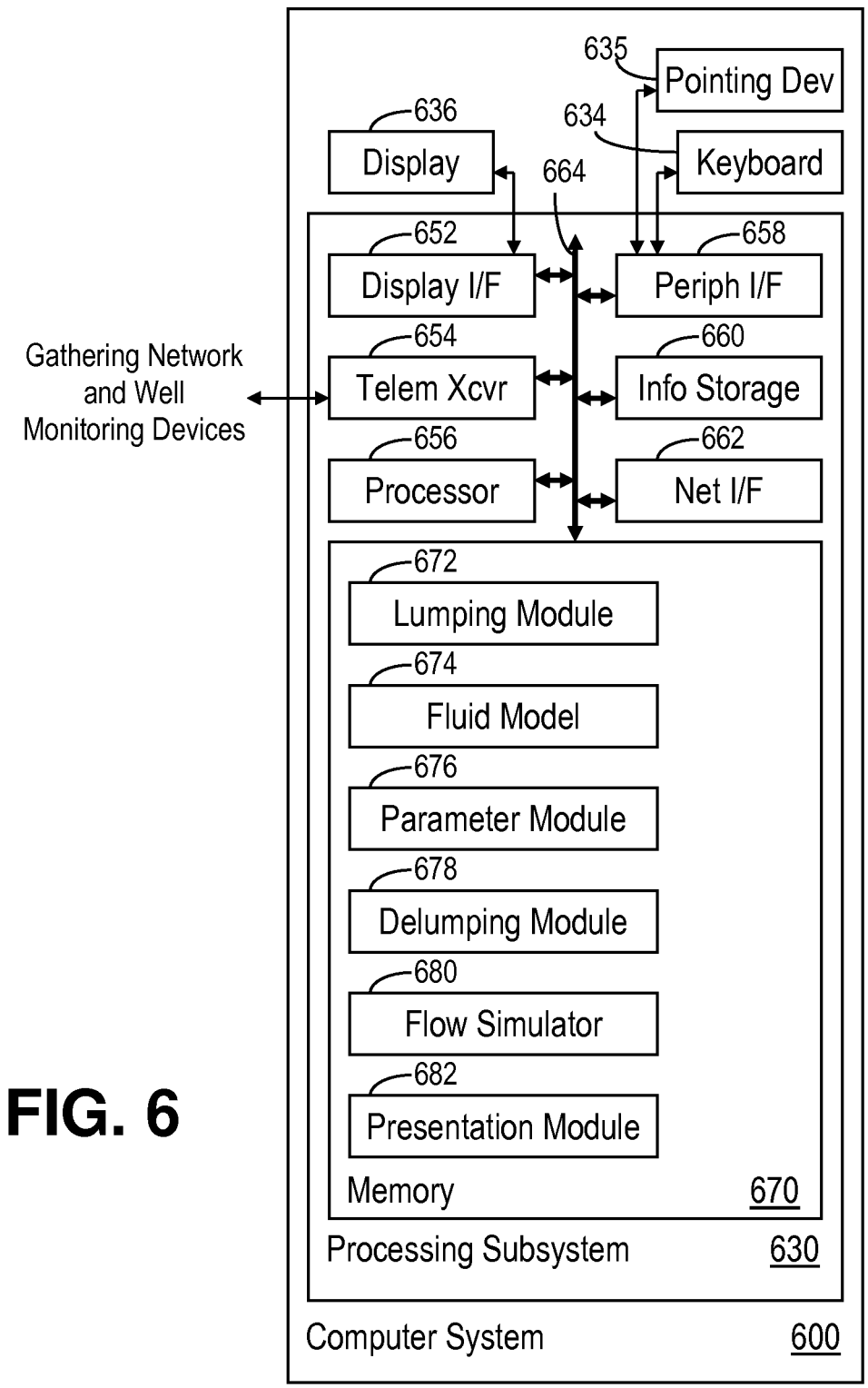
FIG. 6 shows a block diagram of a computer system suitable for implementing the disclosed methods and systems.

In at least some illustrative embodiments, the above-described production system simulation is implemented in software that executes on a computer system such as computer system 600 of FIG. 6. Both hardware and software components of computer system 600 are shown, which in at least some illustrative embodiments implement at least part of the production system simulation shown as method 700 in FIG. 7 (described in more detail below). A user may interact with computer system 600 via keyboard 634, pointing device 635 (e.g., a mouse) and display 636 to configure, control and monitor the execution of the production system simulation.

Located within processing subsystem 630 of computer system 600 is a display interface 652, a telemetry transceiver 654, a processor 656, a peripheral interface 658, an information storage device 660, a network interface 662 and a memory 670. Bus 664 couples each of these elements to each other and transports their communications. Telemetry transceiver 654 enables processing subsystem 630 to communicate with gathering network and well monitoring devices (e.g., via wired and/or wireless communication links), and network interface 662 enables communications with other systems (e.g., via the Internet with a central database server housing historical data). In accordance with user input received via peripheral interface 658 and program instructions from memory 670 and/or information storage device 660, processor 656 processes information received via telemetry transceiver 654 to provide well and gathering network measurements to the production system simulation in accordance with the disclosed methods, and further operates to execute the simulation and present the simulation results to the user.

FIG. 7 shows an illustrative method 700, at least part of which may be implemented by software executing on computer system 600. It should be noted that although the embodiment shown in FIG. 6 shows the various software modules executing on computer system 600, in other illustrative embodiments some or all of the modules may execute on two or more computers within a networked and/or distributed system. Referring now to both FIGS. 6 and 7, the individual real fluid components are lumped together to define one or more common pseudo-components (block 702; lumping module 672). The resulting common pseudo-components are similarly lumped together to define reservoir pseudo-components for each reservoir (block 704; lumping module 672). The state of each reservoir is then determined by applying the model for each reservoir to each corresponding set of reservoir pseudo-components (block 706; fluid model 674). The reservoir states provided by the models enable the determination at least some of the parameters needed by the simulation equations (block 708; parameter module 676). The reservoir pseudo-components are delumped to produce their corresponding common pseudo-components (block 710; delumping module 678).

The parameters, common pseudo-components for the reservoirs and gathering network, and constraints input by the user (facility, gathering network, well and reservoir constraints) are used to together define a fully-coupled set of simulation equations for the reservoirs, well perforations and gathering network (block 712; flow simulator 680). The simulator operates to identify a solution set for the simulation equations that meets a convergence criteria (e.g., a set of residual values within an acceptable range) and provides the predicted fluid flow for the simulated production system (block 714; flow simulator 680). The solution set is presented to the user as updated states of the fluids and operating settings for the various reservoirs, well perforations and the gathering network (block 716; presentation module 682), ending the method (block 718). It should be noted that in at least some illustrative embodiments, the disclosed method 700 is repeated for each time step of the production system simulation. Once the simulation of the production system has been executed for period of time (e.g., 10 years), at least some of the results (e.g., the operating settings from the solution set) can be applied to the actual production system and the actual measured production compared over time with the production results estimated by the simulation. If the actual measurements diverge from the estimated results beyond a predetermined threshold, the simulation can be run again with updated data to provide updated operating settings, a process that may be repeated as needed over the production life of the reservoirs.

The examples that follow illustrate results that are attainable using the above-described systems and methods by comparing simulation results for various combinations of lumped (reservoir) and delumped (common) pseudo-components, together with their respective execution times and divergence from a reference simulation that uses only delumped pseudo-components. Results are shown for each of two reservoirs individually combined with the gathering network, then with both reservoirs concurrently feeding the gathering network. The illustrative simulation assumes a configuration similar to that of FIG. 3 with two sub-sea reservoirs 302 coupled by a gathering network that is on the sea bottom. Riser 309 transports the combined fluids to a platform at the sea surface operating as processing facility 300. For additional detailed conditions assumed in the simulation, see *Simulation Paper* at 14.

Table 7 summarizes the various combinations of lumped and delumped pseudo-component cases for the single-reservoir simulations:

TABLE 7

Single Reservoir Simulation Cases

| Case | Reservoir | Gathering Network | Gathering Net PVT Calculations |
|---|---|---|---|
| 1 | Lumped | Lumped | Lumped |
| 2 | Lumped | Delumped | Delumped |
| 3 | Lumped | Delumped | Lumped (except final separation) |

TABLE 7-continued

Single Reservoir Simulation Cases

| Case | Reservoir | Gathering Network | Gathering Net PVT Calculations |
|---|---|---|---|
| 4 | Delumped | Delumped | Delumped |
| 5 | Delumped | Delumped | Lumped (except final separation) |

Case 4 represents the reference case that uses only delumped pseudo-components throughout, and thus provides the most accurate representation of the phase behavior of the fluids. For these example cases, the fluid delumping uses constant coefficients as shown below in Tables 8 and 9:

TABLE 8

Delumping Coefficients for Condensate Fluid (Reservoir 1)

| Delumped Component | Lumped Component | | |
|---|---|---|---|
| | C4 | C5 | C6_H1 |
| iC4 | 0.633803 | | |
| nC4 | 0.366197 | | |
| iC5 | | 0.517858 | |
| nC5 | | 0.482142 | |
| C6 | | | 0.214483 |
| H1 | | | 0.785517 |

TABLE 9

Delumping Coefficients for Black-Oil Fluid (Reservoir 2)

| Delumped Component | Lumped Component | | | |
|---|---|---|---|---|
| | C2_C3 | C4_C5 | C6_H1 | H3_H5 |
| C2 | 0.633962 | | | |
| C3 | 0.366038 | | | |
| iC4 | | 0.278810 | | |
| nC4 | | 0.159851 | | |
| iC5 | | 0.271376 | | |
| nC5 | | 0.289963 | | |
| C6 | | | 0.114929 | |
| H1 | | | 0.885071 | |
| H3 | | | | 0.954318 |
| H4 | | | | 0.045377 |
| H5 | | | | 0.000305 |

Tables 10 and 11 show the results for the single-reservoir simulations for each case after 11 years of production, including oil in place (OIP) and gas in place (GIP), cumulative oil and gas at the sink (i.e., at the corresponding output of the separator), oil-gas ratio (OGR) and gas-oil ratio (GOR) at 11 years, and CPU utilization for simulating the gathering network:

TABLE 10

Single-Reservoir Simulation Results for Reservoir 1

| Case | OIP (MSTB) | GIP (MMSCF) | Cumulative Oil | | Cumulative Gas | | OGR | Network |
| | | | At Sink (MSTB) | Sum of Wells (MSTB) | At Sink (MMSCF) | Sum of Wells (MMSCF) | At 11 Years (STB/MMSCF) | CPU (Secs) |
|---|---|---|---|---|---|---|---|---|
| 1 | 9451 | 311927 | 4157 | 4157 | 190085 | 190085 | 16.6 | 10.0 |
| 2 | 9451 | 311927 | 4034 | 4034 | 190186 | 190186 | 16.0 | 50.9 |
| 3 | 9451 | 311927 | 4033 | 4157 | 190231 | 190085 | 16.6 | 15.4 |
| 4 | 9237 | 312130 | 3888 | 3888 | 190496 | 190496 | 14.7 | 50.9 |
| 5 | 9237 | 312130 | 3887 | 3887 | 169238 | 169078 | 14.7 | 15.4 |

TABLE 11

Single-Reservoir Simulation Results for Reservoir 2

| Case | OIP (MSTB) | GIP (MMSCF) | Cumulative Oil | | Cumulative Gas | | GOR | Network |
| | | | At Sink (MSTB) | Sum of Wells (MSTB) | At Sink (MMSCF) | Sum of Wells (MMSCF) | At 11 Years (MSCF/STB) | CPU (Secs) |
|---|---|---|---|---|---|---|---|---|
| 1 | 344988 | 289377 | 43281 | 43278 | 40158 | 40161 | 1.16 | 7.5 |
| 2 | 344988 | 289377 | 43436 | 43432 | 40235 | 40240 | 1.16 | 15.1 |
| 3 | 344988 | 289377 | 43351 | 43278 | 40102 | 40161 | 1.15 | 10.9 |
| 4 | 345354 | 288722 | 43574 | 43571 | 40660 | 40665 | 1.18 | 15.6 |
| 5 | 345354 | 288722 | 43467 | 43464 | 40483 | 40488 | 1.17 | 12.4 |

For reservoir 1, the oil in place for the lumped component cases (cases 1-3) is 2.3% more than the delumped component cases (cases 4 and 5). The difference is the results of the difference in the separator calculation when using the lumped versus the delumped components. Oil production for case 1 is 6.9% greater than for case 4 (the full delumped case). The reservoir initially has no oil phase present, but oil drops out around the producer wells during production. The lumped fluid description drops out less of the heavy components, resulting in higher oil production. The final producing OGR is 16.6 STB/MMSCF for case 1 versus 14.7 STB/MMSCF for case 4. The gathering network calculations take five times more CPU time when delumped pseudo-components are used (case 4) as compared to case 1, and almost 90% of this time is spent performing flash calculations to determine fluid properties for the pressure-drop correlations.

For case 2, the fluid is delumped at the well perforations (i.e., the sandface), and the delumped pseudo-components are used for all gathering network calculations (including the wells). The produced mass is within 0.2% of case 1 for oil and gas in place, but the oil production is 3% less than case 1 due to the more accurate separator calculations using the delumped pseudo-components. The close agreement in the mass calculations for oil and gas in place between case 1 and case 2 indicates that the pressure drop calculations are insensitive to the fluid characterization used for the gathering network.

Case 3 is the same as case 2, except that the delumped components are re-lumped for pressure-volume-temperature (PVT) calculations within the gathering network (but not at final separation). The production of oil and gas from the wells (calculated by separating the production of each well individually) is identical to case 1, allowing the reservoir pseudo-components to be delumped at the well perforations without affecting the results. However, oil production at the separator is almost identical to case 2, and case 3 thus reflects the same improved separator calculation accuracy over case 1 because of the use of delumped pseudo-components. Further, case 3 uses 70% less CPU than case 2.

Case 5 uses the delumped common pseudo-components in the reservoir and the gathering network, but uses the lumped reservoir pseudo-components for the PVT calculations (but not at final separation). This case provides very good agreement with case 4 for cumulative production at the separator, again reflecting the lack of sensitivity of the pressure drop correlations to fluid characterizations. The gathering network calculations for case 5 also require 70% less CPU time than case 4.

For reservoir 2, which has a fluid with black-oil behavior and no initial gas saturation, oil and gas in place produced mass results for all cases are within 0.12% of each other, regardless of whether lumped or delumped pseudo-components are used. Similarly, oil production is within 0.7% and gas production is within 1.3% for all cases. Although the average gas saturation at the end of the simulation is over 7% and the producing GOR rises from 0.8 MSCF/STB to 1.18 MSCF/STB, the lumped reservoir pseudo-component characterizations properly reflect these changes. As with reservoir 1, production of oil and gas from reservoir 2 for cases 1 and 3 are in agreement, again demonstrating that delumping at the well perforations does not affect the results if lumped pseudo components are used for the gathering network PVT calculations. Also, there is almost no difference in the cumulative production calculated by separating each well within the reservoir individually versus separating the commingled production through a single separator.

The above simulation results can be extended to a multiple reservoir configuration using the six lumped and delumped pseudo-component cases shown in table 12:

TABLE 12

Multiple Reservoir Simulation Cases

| Case | Reservoir | Riser/Separator | Flowlines/Tubings/Wellbores |
|---|---|---|---|
| 1 | Lumped | Delumped | Lumped |
| 2 | Lumped | Delumped | Delumped |
| 3 | Lumped | Lumped to Reservoir 1 | Lumped |
| 4 | Delumped | Delumped | Delumped |
| 5 | Delumped | Delumped | Lumped |
| 6 | Reservoir 1 Delumped Reservoir 2 Lumped | Delumped | Lumped |

For these example cases, the fluid delumping also uses the constant coefficients shown in Tables 8 and 9. For each of these cases, the gathering network uses the delumped pseudo-components, but the PVT calculations for the riser, separator, flowlines to the wells, tubings and wellbores use the lumped pseudo-components as shown above. The results of the simulations for each case are shown below in Table 13:

TABLE 13

Multiple-Reservoir Simulation Results

| | | | Cumulative Oil | | Cumulative Gas | | GOR | Network |
|---|---|---|---|---|---|---|---|---|
| Case | OIP (MSTB) | GIP (MMSCF) | At Sink (MSTB) | Sum of Wells (MSTB) | At Sink (MMSCF) | Sum of Wells (MMSCF) | At 11 Years (MSCF/STB) | CPU (Secs) |
| 1 | 354439 | 601304 | 40910 | 40084 | 208883 | 210064 | 2.72 | 29.0 |
| 2 | 354439 | 601304 | 40983 | 40155 | 208772 | 209955 | 2.73 | 67.3 |
| 3 | 354439 | 601304 | 41136 | 40305 | 209756 | 210944 | 2.73 | 27.6 |
| 4 | 354591 | 600852 | 41074 | 40171 | 209320 | 210619 | 2.75 | 70.7 |
| 5 | 354591 | 600852 | 40974 | 40072 | 209455 | 210751 | 2.74 | 31.2 |
| 6 | 354225 | 601507 | 40816 | 39848 | 209340 | 210687 | 2.72 | 30.9 |

Because there is no change in how the individual reservoirs are initialized, the oil and gas in place agree with the sum of the corresponding individual reservoir OIP and GIP totals from Tables 10 and 11. As before, case 4 represents the reference case. Case 1 represents the results of the disclosed method of FIG. 7. The fluid in the reservoirs is modeled with the lumped pseudo-components (different for each reservoir), which are delumped at the well perforation into the common pseudo-components. Up to the point where the fluids comingle, PVT calculations in the gathering network utilize re-lumped reservoir pseudo-components. After the point of comingling of fluids (i.e., at the base of the riser), the common pseudo-components are used for PVT calculations. As can be seen in Table 13, the cumulative oil between case 1 and 4 is within 0.4% and cumulative gas is within 0.21%. The difference in cumulative oil is actually less than the differences in the corresponding individual reservoir cases because the cumulative oil is over-predicted by the lumped pseudo-component model for reservoir 1 and under-predicted by the lumped pseudo-component model for reservoir 2.

Unlike the individual reservoir cases, there is a significant difference between summing cumulative oil calculated by separating wells individually versus separating the combined fluid at the separator. Case 1 produces 826 MSTB more with the combined separation, while case 4 produces 903 MSTB more. Also, case 1 requires almost 60% less CPU time for the gathering network calculations than case 4, due to the simple flash calculations of the flowlines and tubings. It should be noted that at any point in the gathering network the common pseudo-components can be lumped into the reservoir pseudo-components, regardless of whether the lumped reservoir pseudo-components were used to simulate the fluid flow in the reservoir itself.

The cumulative oil production for cases 1-3 and 5-6 is within 0.63% of case 4, and the cumulative gas production is within 0.25% of case 4. For all cases where the reservoir pseudo-components are used for PVT calculations in the flowlines and tubings, the gathering network simulation CPU utilization is reduced by approximately 60% when compared to using the common pseudo-components.

Numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A method for determining operating settings of a fluid production system in a time-step of a plurality of time steps comprising a gathering network and a plurality of reservoirs, the method comprising:

lumping one or more common pseudo-components into one or more reservoir pseudo-components associated with each of the plurality of reservoirs, wherein:
  each of the one or more common pseudo-components is associated with the gathering network;
  each of the one or more common pseudo-components is mapped to at least one reservoir pseudo-component within every reservoir of the plurality of reservoirs; and
  at least one of the one or more reservoir pseudo-components associated with one of the plurality of reservoirs is different from at least one reservoir pseudo-component associated with at least one other reservoir of the plurality of reservoirs;
determining a state of each of the plurality of reservoirs with reservoir-specific models using corresponding reservoir pseudo-components;
deriving at least some simulation equation parameters from the determined states of the plurality of reservoirs;
delumping some of the reservoir pseudo-components into corresponding common pseudo-components;
defining a fully-coupled set of simulation equations for the fluid production system with the different reservoir pseudo components using the derived simulation equation parameters, the corresponding common pseudo-components for the reservoir pseudo-components that have been delumped, reservoir pseudo-components for others of the reservoir pseudo-components that have not been delumped, and constraints of the fluid production system;

performing a fully-coupled simulation of the fluid production system with the different reservoir pseudo-components that simultaneously solves the defined fully-coupled set of simulation equations, wherein the simultaneously solved defined fully-coupled set of simulation equations:
  identifies a solution set that meets a convergence criteria, the solution set comprising updated states of fluids and updated operating settings for the fluid production system; and
  provides a predicted fluid flow for the fluid production system; and
presenting the solution set to a user; wherein:
  the user adjusts operating settings for the fluid production system using the updated operating settings to maximize production of hydrocarbons from the fluid production system; and
  the operating settings are selected from the group consisting of:
    a well choke setting,
    a gas lift injection flow rate,
    a reservoir gas injection flow rate,
    a reservoir liquid injection flow rate,
    a production well flow rate,
    a maximum operating pressure,
    a minimum operating pressure, and
    combinations thereof.

2. The method of claim 1, further comprising lumping one or more fluid components into each of the common pseudo-components.

3. The method of claim 2, further comprising ordering the fluid components within a given reservoir according to a common fluid characteristic, wherein the reservoir pseudo-components each comprise fluid components that are within a range of values of the common characteristic.

4. The method of claim 3, wherein the common characteristic comprises a molecular weight or a boiling point.

5. The method of claim 1, wherein the constraints of the fluid production system comprise facility constraints, gathering network constraints, well constraints, or reservoir constraints.

6. The method of claim 1, wherein the fully-coupled simulation includes a volume balance calculation or a mass balance calculation.

7. The method of claim 1, wherein at least some of the defined fully-coupled set of simulation equations comprise gathering network equations, reservoir perforation equations, and reservoir equations where at least some of the reservoir perforation equations and reservoir equations are expressed in terms of the common pseudo-components produced by the delumping.

8. The method of claim 1, wherein at least some of the defined fully-coupled set of simulation equations comprise gathering network equations, reservoir perforation equations, and reservoir equations where at least some of the gathering network equations, reservoir perforation equations, and reservoir equations are expressed in terms of the reservoir pseudo-components, wherein a fluid being simulated originates from a corresponding reservoir and has not mixed with fluids from any of the other reservoirs.

9. The method of claim 1, wherein the reservoir-specific models comprise a black-oil model.

10. The method of claim 1, wherein all steps of the method are repeated for each time step of the plurality of time steps.

11. A fluid production system simulator, comprising:
a memory having modeling and simulation software; and
one or more processors coupled to the memory, the software causing the processors, in a time step of a plurality of time steps, to:
  lump one or more common pseudo-components into one or more reservoir pseudo-components associated with each of a plurality of reservoirs of the fluid production system, wherein:
    each of the one or more common pseudo-components is associated with a gathering network of the fluid production system;
    each of the one or more common pseudo-components is mapped to at least one reservoir pseudo-component within every reservoir of the plurality of reservoirs; and
    at least one of the one or more reservoir pseudo-components associated with one of the plurality of reservoirs is different from at least one reservoir pseudo-component associated with at least one other reservoir of the plurality of reservoirs;
  determine a state of each of the plurality of reservoirs with reservoir-specific models using corresponding reservoir pseudo-components;
  derive at least some simulation equation parameters from the determined states of the plurality of reservoirs;
  delump some of the reservoir pseudo-components into corresponding common pseudo-components;
  define a fully-coupled set of simulation equations for the fluid production system with the different reservoir pseudo-components using the derived simulation parameters, the corresponding common pseudo-components for the reservoir pseudo-components that have been delumped, reservoir pseudo-components for others of the reservoir pseudo-components that have not been delumped, and constraints of the fluid production system;
  perform a fully-coupled simulation of the fluid production system with the different reservoir pseudo-components that simultaneously solves the defined fully-coupled set of simulation equations, wherein the simultaneously solved defined fully-coupled set of simulation equations:
    identifies a solution set that meets a convergence criteria, the solution set comprising updated states of fluids and updated operating settings for the fluid production system; and
    provides a predicted fluid flow for the fluid production system; and
  present the solution set to a user; wherein:
    the user adjusts operating settings for the fluid production system simulated by the fluid system simulator using the updated operating settings to maximize production of hydrocarbons from the fluid production system; and
    the operating settings are selected from the group consisting of:
      a well choke setting,
      a gas lift injection flow rate,
      a reservoir gas injection flow rate,
      a reservoir liquid injection flow rate,
      a production well flow rate,
      a maximum operating pressure,
      a minimum operating pressure, and
      combinations thereof.

12. The system of claim 11, further comprising causing the one or more processors to lump one or more fluid components into each of the common pseudo-components.

13. The system of claim 12, further comprising causing the one or more processors to order the fluid components within a given reservoir according to a common fluid characteristic, wherein the reservoir pseudo-components each comprise fluid components that are within a range of values of the common characteristic.

14. The system of claim 13, wherein the common characteristic comprises a molecular weight or a boiling point.

15. The system of claim 11, wherein the constraints of the fluid production system comprise facility constraints, gathering network constraints, well constraints, or reservoir constraints.

16. The system of claim 11, wherein the fully-coupled simulation includes a volume balance calculation or a mass balance calculation.

17. The system of claim 11, wherein at least some of the defined the fully-coupled set of equations comprise gathering network equations, reservoir perforation equations, and reservoir equations where at least some of the reservoir perforation equations and reservoir equations are expressed in terms of the common pseudo-components produced by the delumping.

18. The system of claim 11, wherein at least some of the defined fully-coupled set of simulation equations comprise gathering network equations, reservoir perforation equations, and reservoir equations where at least some of the gathering network equations, reservoir perforation equations and reservoir equations are expressed in terms of the reservoir pseudo-components, wherein a fluid being simulated originates from a corresponding reservoir and has not mixed with fluids from any of the other reservoirs.

19. The system of claim 11, wherein the reservoir-specific models comprise a black-oil model.

20. The system of claim 11, wherein the modeling and simulation software repeats each step taken by the one or more processors for each time step of the plurality of time steps.

* * * * *

UNITED STATES PATENT AND TRADEMARK OFFICE
CERTIFICATE OF CORRECTION

PATENT NO. : 10,677,022 B2
APPLICATION NO. : 14/408196
DATED : June 9, 2020
INVENTOR(S) : Graham Christopher Fleming and Terry Wayne Wong Page 1 of 2

It is certified that error appears in the above-identified patent and that said Letters Patent is hereby corrected as shown below:

In the Specification

In Column 12, Line 7 approximately, delete "$R_{rnc_r+1} = V_{Pr} - V_{Pr}$," and insert --$R_{r,nc_r+1} = V_{Pr} - V_{Fr}$--

In Column 12, Line 20 approximately, delete "$Q_{rpl} = C_p \Delta \phi_p \sum_{m=1}^{Nphases} \frac{krel_{rm}}{\mu_{rm}} \rho_{rm} z_{rmi}$," and insert --$Q_{rpi} = C_p \Delta \phi_p \sum_{m=1}^{Nphases} \frac{krel_{rm}}{\mu_{rm}} \rho_{rm} z_{rmi}$--

In Column 12, Line 48 approximately, delete "$Q_{rpi} = \sum_{i=1}^{nc_f} \alpha_{ij} Q_{fpi}$," and insert --$Q_{rpi} = \sum_{j=1}^{nc_f} \alpha_{ij} Q_{fpj}$--

In Column 12, Line 50 approximately, delete "$Q_{fpi} = \sum_{i=1}^{nc_r} \beta_{ij} Q_{rpi}$," and insert --$Q_{fpi} = \sum_{j=1}^{nc_r} \beta_{ij} Q_{rpj}$--

In Column 12, Line 55, after –components, and– delete "$Q_{fpi}$ and $Q_{fpi}$" and insert -- $Q_{fpi}$ and $Q_{fpj}$ --

In Column 13, Line 18 approximately, delete "$Q_{fpi}^{Set2} = z_{fpi} \sum_{i=1}^{nc_f} Q_{fpi}$," and insert --$Q_{fpi}^{Set2} = z_{fpi} \sum_{j=1}^{nc_f} Q_{fpj}$--

Signed and Sealed this
First Day of September, 2020

Andrei Iancu
*Director of the United States Patent and Trademark Office*

CERTIFICATE OF CORRECTION (continued)
U.S. Pat. No. 10,677,022 B2

In Column 13, Line 35 approximately, delete "$\sum_{i=1}^{nc_f} p_{ij} Q_{fpi} = 0$,"
and insert --$\sum_{i=1}^{nc_f} p_{ij} Q_{fpj} = 0$--